United States Patent
Duriez et al.

(10) Patent No.: US 9,558,942 B1
(45) Date of Patent: Jan. 31, 2017

(54) HIGH DENSITY NANOWIRE ARRAY

(71) Applicant: Taiwan Semiconductor Manufacturing Company, Ltd., Hsin-Chu (TW)

(72) Inventors: Blandine Duriez, Bruxelles (DE); Martin Christopher Holland, Bertem (DE); Yee-Chia Yeo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/868,641

(22) Filed: Sep. 29, 2015

(51) Int. Cl.
*H01L 21/02* (2006.01)
*H01L 29/06* (2006.01)
*H01L 21/3105* (2006.01)
*H01L 21/311* (2006.01)

(52) U.S. Cl.
CPC ..... *H01L 21/02603* (2013.01); *H01L 21/0262* (2013.01); *H01L 21/02532* (2013.01); *H01L 21/02538* (2013.01); *H01L 21/02639* (2013.01); *H01L 21/31055* (2013.01); *H01L 21/31116* (2013.01); *H01L 29/0676* (2013.01)

(58) Field of Classification Search
CPC .............. H01L 21/02603; H01L 21/02532; H01L 21/02538; H01L 21/0262; H01L 21/031055; H01L 21/31116; H01L 29/0676; Y10S 977/742; Y10S 977/948; Y10S 977/936; H01Q 15/0013; H01Q 15/0006
See application file for complete search history.

(56) References Cited

U.S. PATENT DOCUMENTS

| | | | | |
|---|---|---|---|---|
| 2008/0090401 | A1* | 4/2008 | Bratkovski | H01Q 15/0006 438/597 |
| 2008/0178921 | A1* | 7/2008 | Ye | H01L 35/34 136/225 |
| 2011/0309382 | A1* | 12/2011 | Lowgren | B82Y 20/00 257/88 |

FOREIGN PATENT DOCUMENTS

| | | |
|---|---|---|
| TW | 201020206 A | 6/2010 |
| TW | 201102343 A | 1/2011 |
| TW | 201404709 A | 2/2014 |
| TW | 201505071 A | 2/2015 |

* cited by examiner

*Primary Examiner* — Latanya N Crawford
(74) *Attorney, Agent, or Firm* — Haynes and Boone, LLP

(57) ABSTRACT

A method of fabricating a nanowire array is disclosed. The method includes forming a mask layer over a substrate, wherein the mask layer includes a plurality of openings; growing a first plurality of nanowires through the plurality of openings; forming a conformal layer over the first plurality of nanowires and the mask layer; planarizing the conformal layer over the first plurality of nanowires to form a coplanar top surface defined by the first plurality of nanowires and the conformal layer; removing a portion of the conformal layer and a portion of the mask layer to expose the substrate, wherein the portions of the conformal layer and the mask layer are located between adjacent nanowires from the plurality of nanowires; and growing a second plurality of nanowires on the exposed substrate.

20 Claims, 9 Drawing Sheets

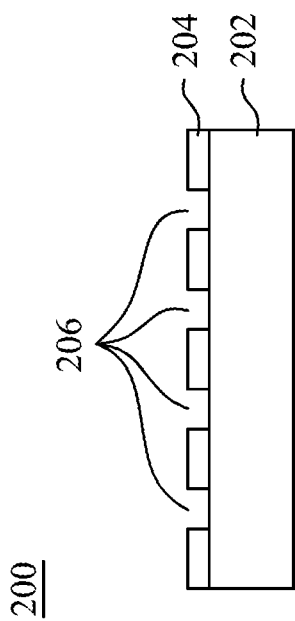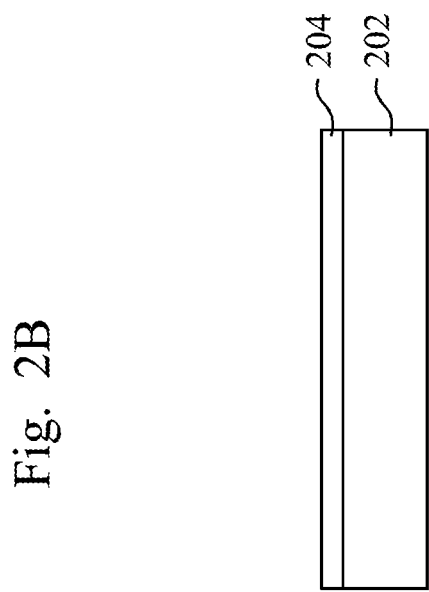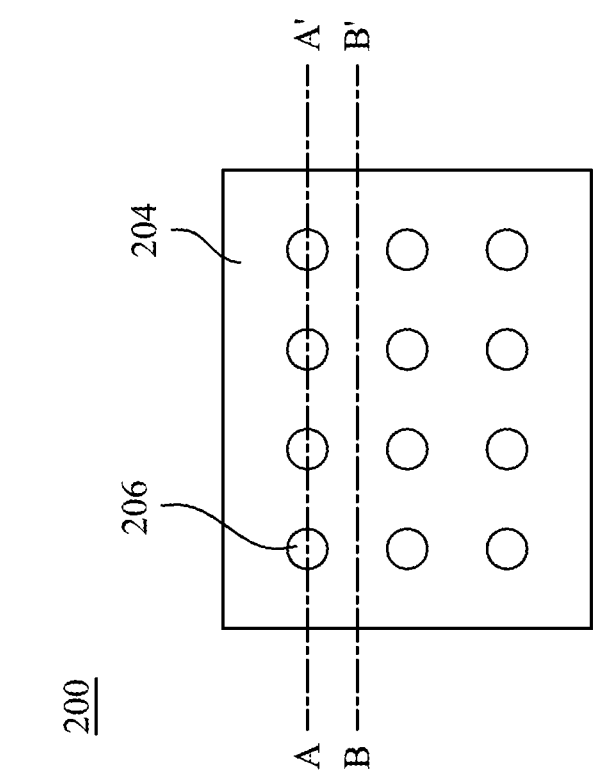

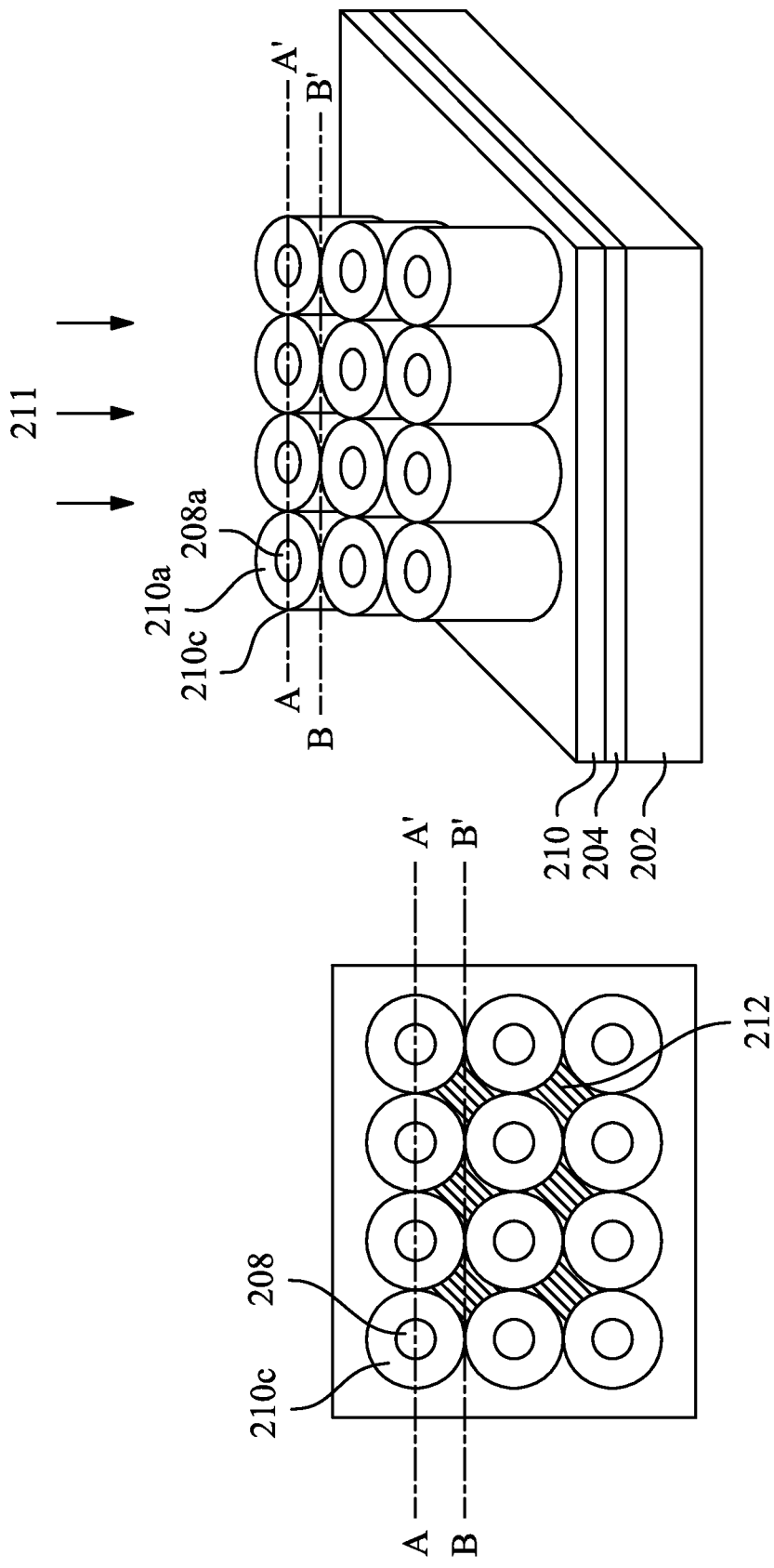

HIGH DENSITY NANOWIRE ARRAY

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, functional density (i.e., the number of interconnected devices per chip area) has generally increased while geometry size (i.e., the smallest component (or line) that can be created using a fabrication process) has decreased. Despite advances in materials and fabrication, in order to further decrease the geometry size, conventional planar MOSFET devices have encounter challenging(s). As such, a variety of devices that are not planar-based or include non-planar components have attracted attention such as, for example, a Fin FET device, a vertical FET, etc.

While a variety of techniques to fabricate a non-planar device (e.g., a vertical FET) based on a nanowire/nanowire array have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIG. 2A depicts a top view of an array of nanowires fabricated by the method of FIG. 1 in accordance with various embodiments.

FIGS. 2B and 2C depict cross-sectional views of the array of nanowires with respect to FIG. 2A in accordance with various embodiments.

FIGS. 5A and 5B respectively depict top and prospective views of an array of nanowires fabricated by the method of FIG. 1 in accordance with various embodiments.

Figure 1:
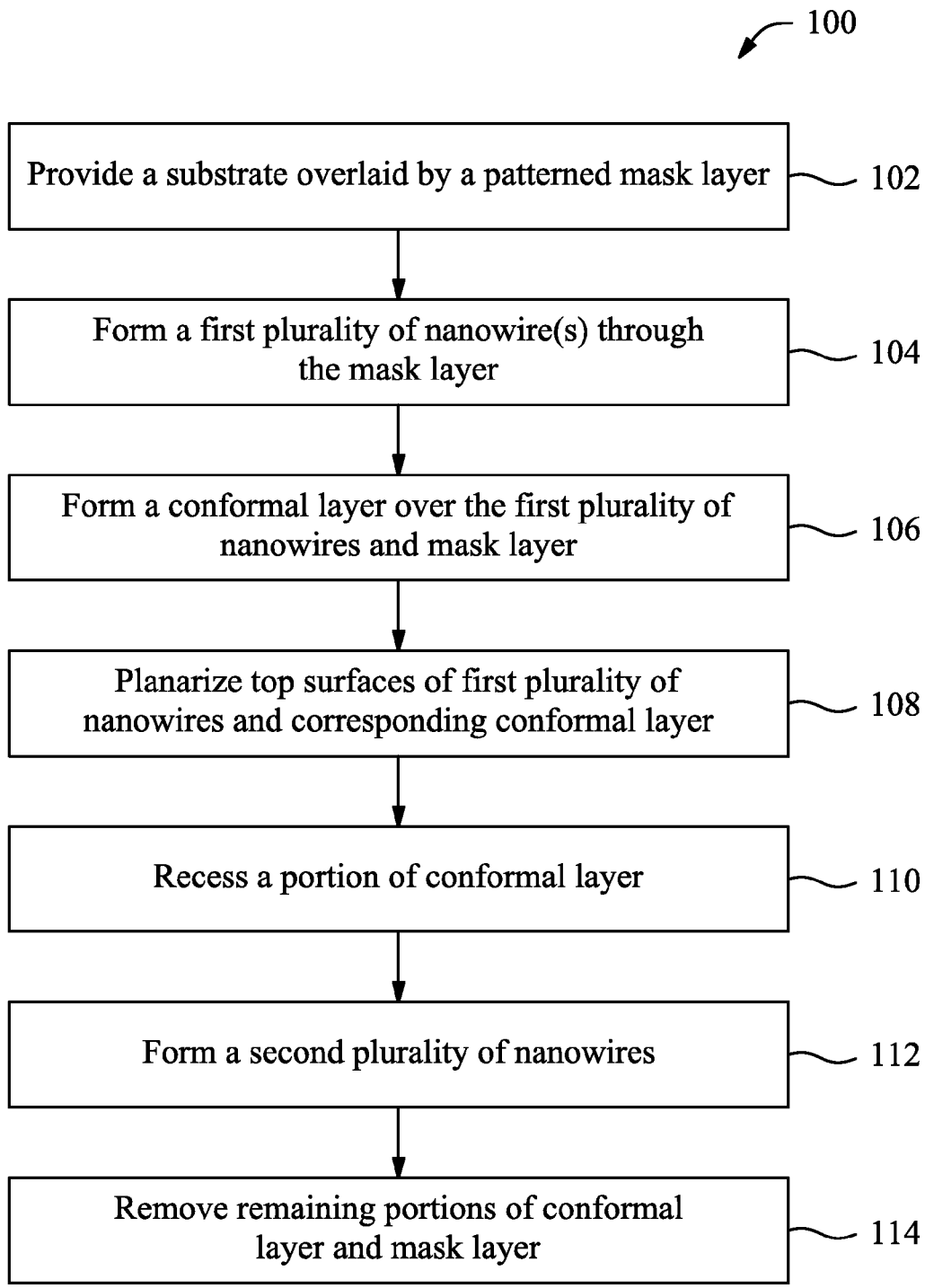
FIG. 1 depicts a method of fabricating an array of nanowires in accordance with various embodiments.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 3B:
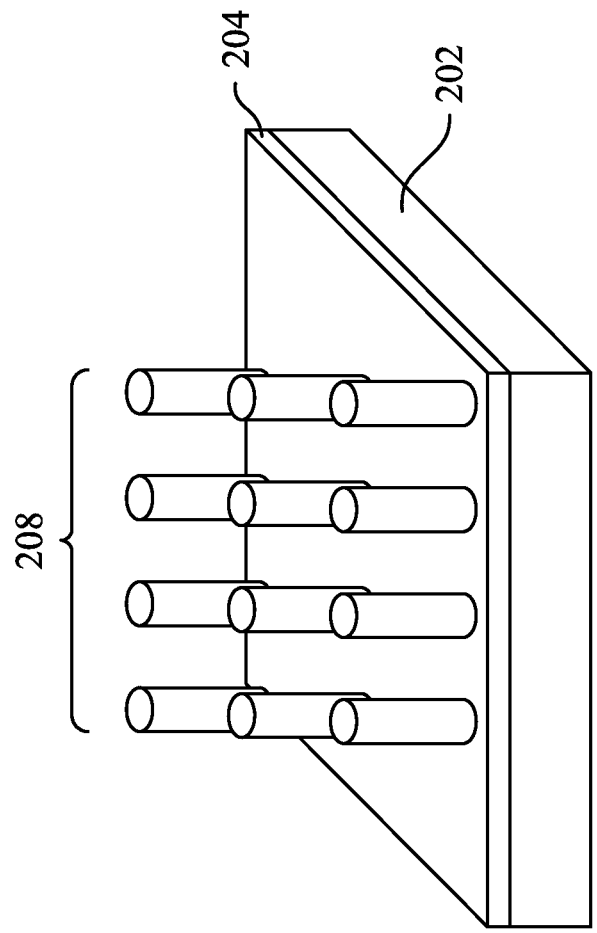
FIGS. 3A and 3B respectively depict top and prospective views of an array of nanowires fabricated by the method of FIG. 1 in accordance with various embodiments.

FIG. 1 is a flowchart of a method 100 of fabricating an array of nanowires 200 constructed according to various aspects of the present disclosure in one or more embodiments. The method 100 is described with reference to FIG. 1 and in conjunction with FIGS. 2A, 2B, 2C, 3A, 3B, 4A, 4B, 5A, 5B, 5C, 5D, 6A, 6B, 6C, 7A, 7B, 7C, 8A, and 8B. More specifically, FIGS. 2A, 3A, 4A, 5A, 6A, 7A, and 8A are top views of forming the array of nanowires 200 by the method 100 according to some embodiments; FIGS. 2B, 2C, 5C, 5D, 6B, 6C, 7B, 7C, and 8B are cross sectional views of forming the array of nanowires 200 by the method 100 according to some embodiments; FIGS. 3B, 4B, and 5B are perspective views of forming the array of nanowires 200 by the method 100 according to some embodiments. In some embodiments, the array of nanowires 200 fabricated according to the disclosed method 100 may be an element of a field-effect-transistor (FET). For example, the array of nanowires may each form a channel, a source feature, and/or a drain feature of a vertical FET. It is understood that additional steps can be provided before, during, and/or after the method 100, and some of the steps described can be replaced, eliminated, and/or moved around for additional embodiments of the method 100.

Referring to FIGS. 1, 2A, 2B, and 2C, the method 100 begins at operation 102 with providing a substrate 202 overlaid by a patterned mask layer 204. As described above, FIG. 2A is the top view of the array 200; and FIGS. 2B and 2C further include two cross sectional views of the array 200, FIGS. 2B(AA') and 2C(BB'). FIG. 2B represents the cross sectional view of the array 200 along the line AA' with respect to FIG. 2A; and FIG. 2C represents the cross sectional view of the array 200 along the line BB' with respect to FIG. 2A.

Referring still to FIGS. 2A, 2B, and 2C, in an embodiment, the substrate 202 is a semiconductor substrate and includes silicon. Alternatively, the substrate includes germanium, silicon germanium or other proper semiconductor materials such as III/V materials. In another embodiment, the substrate 202 may include a buried dielectric material layer for isolation formed by a proper technology, such as a technology referred to as separation by implanted oxygen (SIMOX). In some embodiments, the substrate 202 may be a semiconductor on insulator, such as silicon on insulator (SOI). Regarding the mask layer 204, in accordance with some embodiments, the patterned mask layer 204 may be formed of a dielectric layer such as, for example, $SiN_x$ and/or $SiO_x$. The patterned mask layer 204 may be formed by using any of a variety of deposition processes such as, for example, a physical vapour deposition (PVD) process, a chemical vapour deposition (CVD) process, and/or an atomic layer deposition (ALD) process following by a patterning process to form the openings 206. In the current embodiment, the openings 206 extending through mask layer 204 may be formed by using one of a variety of approaches that are suitable to form an opening with a well-controlled size (e.g., diameter) and position through a mask layer. For example, the openings 206 may be formed by using an electron beam lithography (EBL), a nanoimprint lithography, an optical lithography and a reactive ion etching (RIE) and/or a wet chemical etching method. In the current embodiment of FIG. 2A, the patterned mask layer 204 includes an array of openings 206 and such an array has a first density, for example, 12 nanowires per substrate.

Although as illustrated in FIG. 2A, each of the openings 206 has a curvilinear shape (e.g., a circle), the opening 206 may have any of a variety of shapes such as, for example, a square, a polygon, a triangle, etc. As each of the openings 206 is described as a circle, each opening 206 may have a diameter $D_1$. In some embodiments, the diameter $D_1$ may range between about 15 nanometers to about 100 nanometers.

Figure 3A:
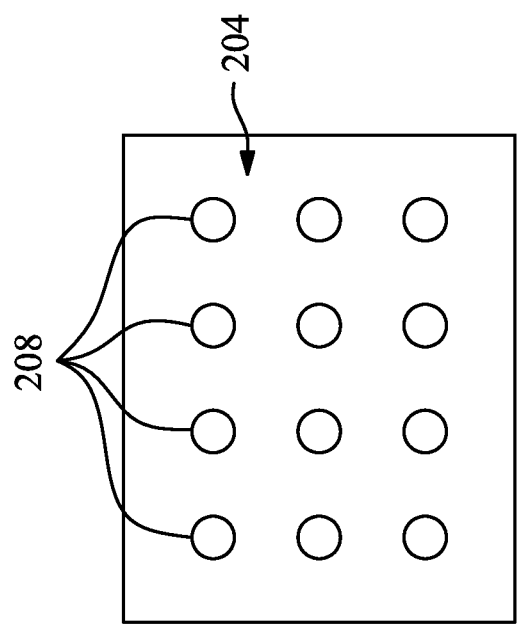
Figure 4B:
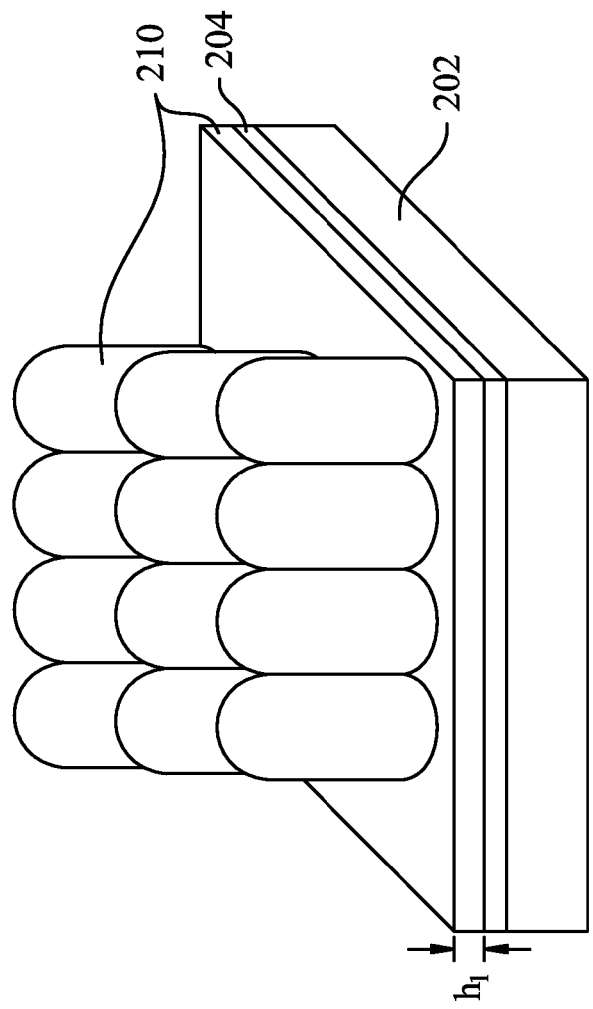
FIGS. 4A and 4B respectively depict top and prospective views of an array of nanowires fabricated by the method of FIG. 1 in accordance with various embodiments.

Referring now to FIGS. 1, 3A, and 3B, the method 100 proceeds to operation 104 with forming a first plurality of nanowires 208 through the openings 206. As described above, FIG. 3A is the top view of the array 200; and FIG. 3B further includes a prospective view of the array 200. According to some embodiments, the nanowire 208 may be formed of a material that is the same or different than the material of the substrate 202. In an example, the nanowire 208 may be formed of III/V or II-VI compound materials (e.g., InAs, GaAs, InP, GaN, etc.) while the material of the substrate is formed of silicon. In another example, the nanowire 208 may be formed of silicon while the material of the substrate is also formed of silicon. As such, the nanowire 208 may include at least one of a variety of materials such as, for example, silicon, germanium, InAs, InP, GaAs, GaSb, InSb, GaP, InGaAs, InGaP, and/or a combination thereof. In a specific embodiment, forming nanowire 208 through the opening 206 may include a selective area growth metal organic chemical vapour deposition (SAG-MOCVD) or metal organic vapour phase epitaxy (SAG-MOVPE). In other embodiments, the forming nanowire 208 may include any of a variety of deposition approaches (e.g., CVD, MOCVD) and remain within the scope of the present disclosure. In an embodiment, since the nanowire 208 is formed following the opening 206 in the mask layer 204, the nanowire 208 may include a curvilinear cross-section (i.e. circular shape) and such a curvilinear nanowire 208 may include a diameter that is approximately the same as diameter $D_1$. Moreover, in some embodiments, each of the nanowires 208 may include an individual height, with averaged height ranges between about hundreds of nanometers (e.g., 200 nanometers) to about tens of micrometers (e.g., 10 micrometers).

Figure 4A:
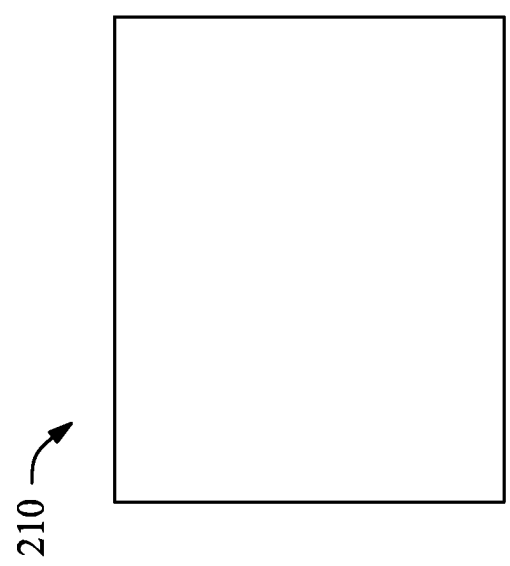
Figure 5C:
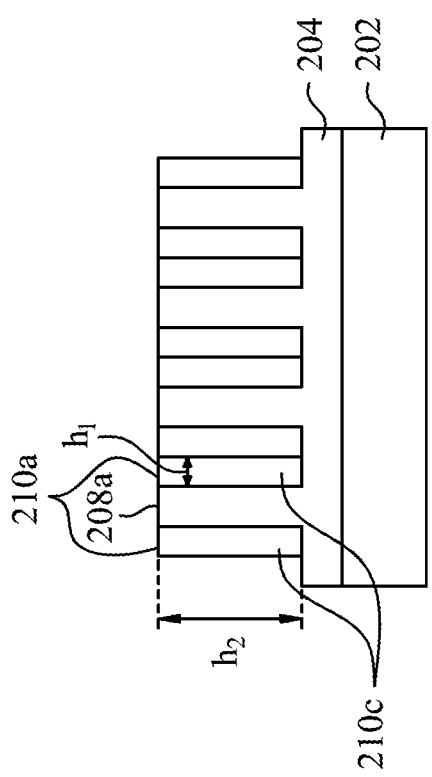
FIGS. 5C and 5D depict cross-sectional views of the array of nanowires with respect to FIGS. 5A and 5B in accordance with various embodiments.

Referring now to FIGS. 1, 4A, and 4B, the method 100 proceeds to operation 106 with forming a conformal layer 210 over the first plurality of nanowires 208 and the patterned mask layer 204. As described above, FIG. 4A is the top view of the array 200; and FIG. 4B further includes a prospective view of the array 200. As shown, conformal layer 210 has a substantially uniform thickness. Such a thickness may be chosen according to a variety of parameters such as, for example, the density of the formed nanowires 208, diameter(s) of the formed nanowires 208, etc., which will be described below with respect to FIG. 5A. In the illustrated embodiment of FIG. 4B, the conformal layer 210 covers a portion of the mask layer 204 and extends along a sidewall of each of the nanowires 208. As such, for the sake of clarity, the conformal layer 210 may include multiple portions (or segments). For example, the portion of the conformal layer 210 that extends along the sidewall of the nanowire 208 is referred to as corresponding conformal layer 210c and the portion of the conformal layer 210 that is in contact with the mask layer 204 and located at space between neighboring nanowire(s)/corresponding conformal layer(s) is referred to as interstice conformal layer 212. In some embodiments, the conformal layer 210 may be formed of any of a variety of materials that has a different etching selectivity than the nanowire 208 such as, for example, amorphous silicon, $SiO_x$, $SiN_x$, etc. In particular, the forming of the conformal layer 210 may include using atomic layer deposition (ALD), plasma-enhanced chemical vapor deposition (PECVD), and/or any of a variety of deposition approaches while remaining within the scope of the present disclosure. Moreover, in some embodiments, the conformal layer 210 may include a substantially uniform thickness "$h_1$", which ranges between about 20 nanometers to about 50 nanometers.

Figure 5D:
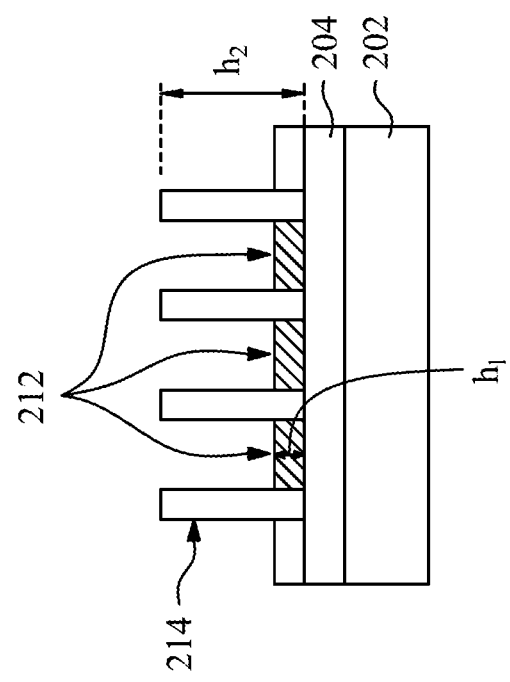

The method 100 continues to operation 108 with planarizing top surfaces of each of the nanowires 208 and each nanowire's corresponding conformal layer 210c, as illustrated in FIGS. 5A and 5B. In some embodiments, the planarization may include using a chemical-mechanical polishing/planarization process. FIGS. 5A and 5B respectively illustrates an example of the top view and the perspective view of the device 200 after the planarization. Further, FIG. 5C illustrates examples of the cross section views of the device 200 along the line AA' and FIG. 5D illustrates examples of the cross section views of the device 200 along the line BB' with respect to FIGS. 5A and 5B.

Referring to FIG. 5A, as shown, the sidewall of each nanowire 208 may be wrapped by the corresponding conformal layer 210c, and moreover, the corresponding conformal layers 210c of each neighboring nanowire 208 are substantially adjacent. In the illustrated example of FIG. 5A, the corresponding conformal layer 210c of each nanowire 208 forms a circle shape, and each corresponding conformal layer 210c touches (or physically contacts) with each of the neighboring corresponding conformal layers. In some embodiments, the corresponding conformal layer 210c of each nanowire 208 may form a curvilinear shape (i.e. circular shape), and each corresponding conformal layer 210c may be in contact with each of the neighboring corresponding conformal layers at more than one point (e.g., neighboring corresponding conformal layers may merge partially). Regardless of the embodiments of the corresponding conformal layer 210c, the interstice conformal layer 212 may be formed between multiple neighboring nanowires/correspond conformal layers. In the illustrated embodiments of FIGS. 5A and 5B, the interstice conformal layer 212 is surrounded/defined by four neighboring nanowires/corresponding conformal layers. Referring now to FIGS. 5C and 5D, as described above, since each corresponding conformal layer 210c is in contact with at least one neighboring corresponding conformal layer, a merged conformal layer 214 may be formed.

Still referring to FIGS. 1, 5B, 5C, and 5D, after the planarization process at operation 108, a coplanar surface 210a/208a is formed by the nanowire(s) 208 and the corresponding conformal layer(s) 210c. As such, each of the nanowires 208 as well as the merged conformal layer 214 have a substantially similar height "$h_2$" (as illustrated in FIG. 5C).

Figure 6B:
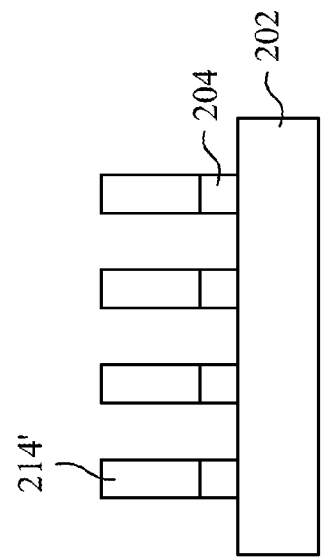
FIGS. 6B and 6C depict cross-sectional views of the array of nanowires with respect to FIG. 6A in accordance with various embodiments.
Figure 6C:
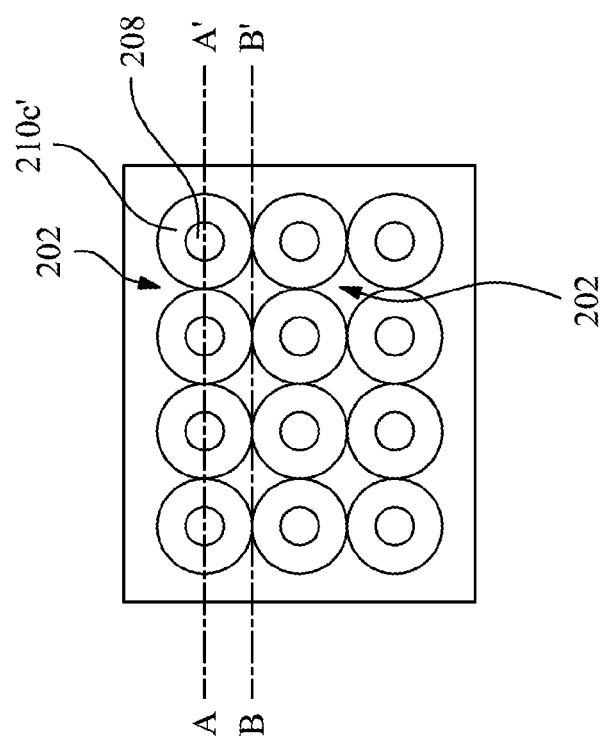
Figure 6A:
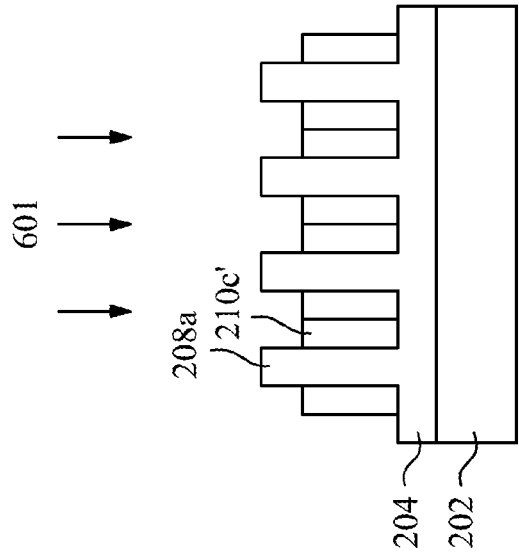
FIG. 6A depicts a top view of an array of nanowires fabricated by the method of FIG. 1 in accordance with various embodiments.

Referring now to FIGS. 1, 6A, 6B, and 6C, the method 100 proceeds to operation 110 with recessing a portion of the conformal layer 210 by a selective etching process 601. As illustrated in FIG. 6B, after applying the selective etching process 601 on the nanowires 208, the corresponding conformal layers 210c, and the interstice conformal layers 212, the nanowire(s) 208 remains intact due to its etching selectivity being different from the conformal layer 210. That is, an upper portion of the corresponding conformal layer(s) 210c is etched/removed (as illustrated in FIG. 6B), the interstice conformal layer(s) 212 and corresponding overlaid mask layer 204 are etched/removed (as illustrated in FIG. 6C) during operation 110. As such, the top surface of the nanowire 208 is exposed and a remaining portion of the corresponding conformal layer 210c' is formed. Additionally, the portion of the substrate 202 that is located among neighboring merged conformal layers 214/214' is exposed after performing operation 110. In some embodiments, the selective etching process 601 occurring during operation 110 includes a dry etching process (e.g., a plasma-assisted dry etching). In other embodiments, the selective etching process 601 may include a dry etching process, a wet etching process, and/or combination thereof.

Figure 7B:
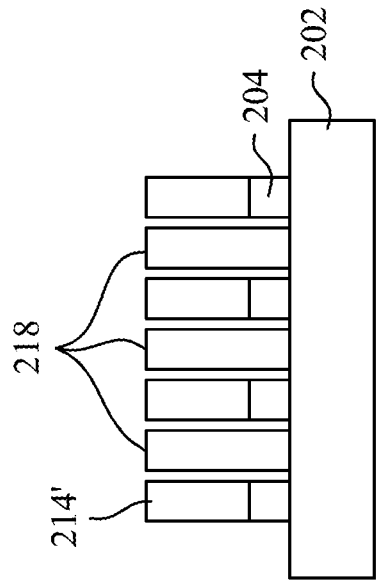
FIGS. 7B and 7C depict cross-sectional views of the array of nanowires with respect to FIG. 7A in accordance with various embodiments.
Figure 7C:
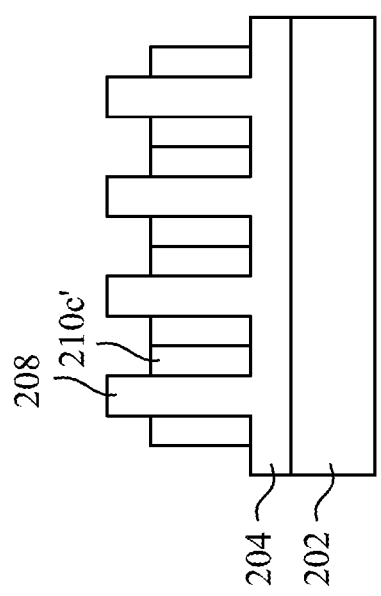
Figure 7A:
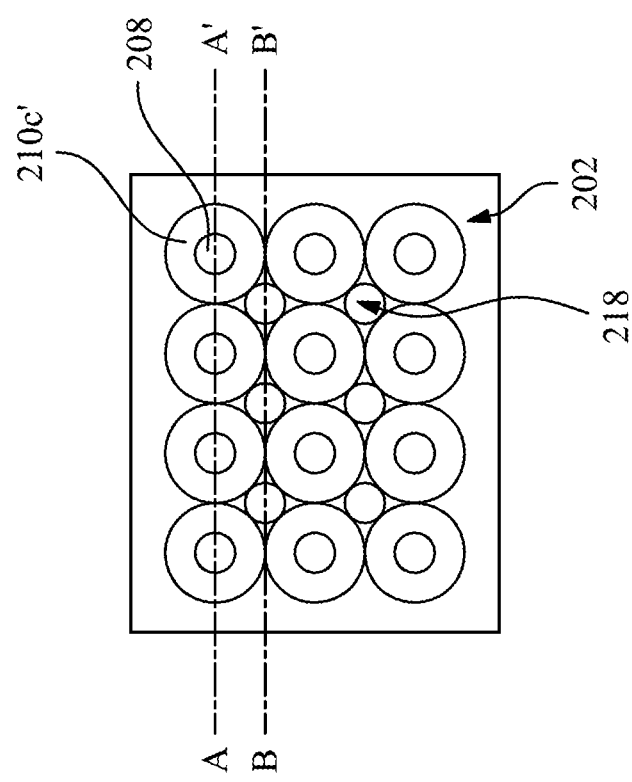
FIG. 7A depicts a top view of an array of nanowires fabricated by the method of FIG. 1 in accordance with various embodiments.

Referring now to FIGS. 1, 7A, 7B, and 7C, method 100 proceeds to operation 112 with forming a second plurality of nanowires 218 among neighboring merged conformal layers 214/214'. In some embodiments, each of the second plurality of nanowires 218 may be formed from the substrate 202 and, more particularly, located in the space between multiple neighboring remaining corresponding conformal layers 210c', where the interstice conformal layers 212 were used to be (as illustrated in FIG. 7C). As such, the merged conformal layers 214/214' and the remaining corresponding conformal layers 210c' may form a patterned mask layer for forming the second plurality of nanowires 218.

According to some embodiments, the nanowire 218 may be formed of a material that is the same or different than the material of the first plurality of nanowires 208 and the substrate 202. As such, the nanowire 218 may include at least one of a variety of materials such as, for example, silicon, germanium, InAs, InP, GaAs, GaSb, InSb, GaP, InGaAs, InGaP, and/or a combination thereof. In a specific embodiment, forming the nanowire 218 among neighboring merged conformal layers 214/214' may include a selective area growth metal organic chemical vapour deposition (SAG-MOCVD) or metal organic vapour phase epitaxy (SAG-MOVPE). In other embodiments, forming nanowires 218 may include any of a variety of deposition approaches (e.g., CVD, MOCVD) and still remain within the scope of the present disclosure.

Figure 8B:
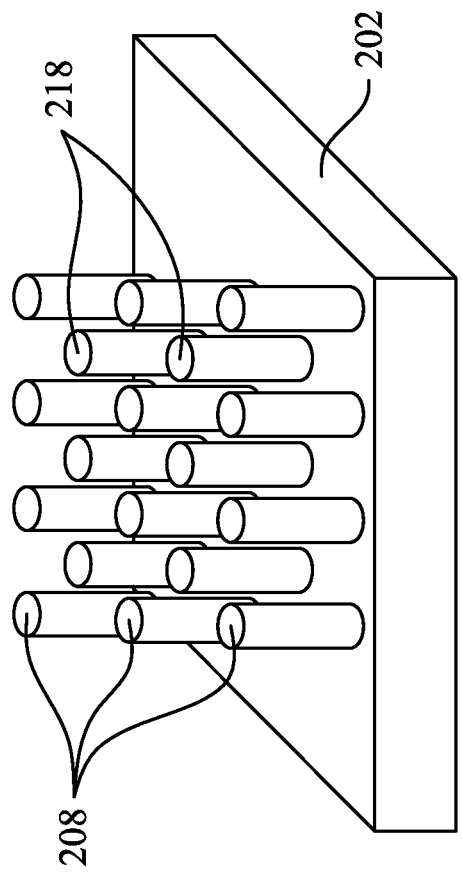
FIGS. 8A and 8B respectively depict top and prospective views of an array of nanowires fabricated by the method of FIG. 1 in accordance with various embodiments.
Figure 8A:
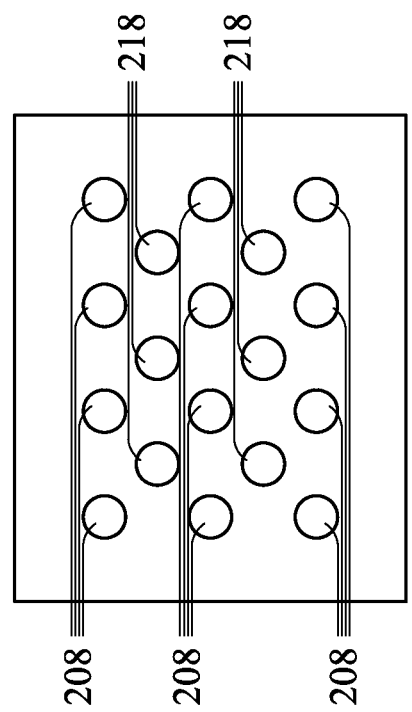

Referring now to FIGS. 1, 8A, and 8B, the method 100 proceeds to operation 114 with removing remaining conformal layer 210c' and mask layer 204. In some embodiments, the removing of the remaining conformal layer and mask layer may include using a wet etching process and/or a dry etching process. As illustrated in FIGS. 8A and 8B, after the remaining conformal layer 210c' and mask layer 204 are removed from the substrate 202, the first plurality of nanowires 208 and the second plurality of nanowires 218 form a new array of nanowires and such a new array of nanowires may has a second density of nanowires such as, for example, 24 nanowires per substrate (that is, twice the first density). Thus, by using the embodiments of the disclosed method, a higher density of nanowires may be formed.

Typically, it requires one or more patterning processes to increase a density of a nanowire array. During such typical process processes, several issues may occur during. For example, a bridging between any two or more of the nanowires among the array may occur, damage caused to a surface of a nanowire may occur, etc. By contrast, by using the embodiments of the current disclosure, a first array of nanowires is formed by using a first patterned mask layer, and a sacrificial layer (e.g., the conformal layer) is formed over sidewalls of the nanowires of the array. Such a sacrificial layer may substantially form a second patterned mask layer that is embedded (intersected) within the first patterned mask layer. Thereafter, by using the second patterned mask layer, a second array of nanowires is formed. As such, together with the first and the second arrays of nanowires, a higher density a nanowire array may be formed.

Various embodiments of a method of fabricating a nanowire array are disclosed. In an embodiment, the method includes forming a mask layer over a substrate, wherein the mask layer includes a plurality of openings; growing a first plurality of nanowires through the plurality of openings; forming a conformal layer over the first plurality of nanowires and the mask layer; planarizing the conformal layer over the first plurality of nanowires to form a coplanar top surface defined by the first plurality of nanowires and the conformal layer; removing a portion of the conformal layer and a portion of the mask layer to expose the substrate, wherein the portions of the conformal layer and the mask layer are located between adjacent nanowires from the plurality of nanowires; and growing a second plurality of nanowires on the exposed substrate.

In another embodiment, the method includes growing a first plurality of nanowires through a plurality of openings defined by a mask layer disposed over a substrate; forming a conformal layer over the first plurality of nanowires and the mask layer; removing a portion of the conformal layer and the mask layer that is positioned between adjacent nanowires from the first plurality of nanowires to expose the substrate; growing a second plurality of nanowires on the exposed substrate; and removing remaining portions of the conformal layer and the mask layer from the substrate.

Yet in another embodiment, the method includes forming a first array of nanowires over a substrate; forming a conformal layer over the first array of nanowires; removing a first portion of the conformal layer to expose the first array of nanowires; removing a second portion of the conformal layer that is positioned between adjacent nanowires from the first array of nanowires to expose the substrate; forming a second array of nanowires on the exposed substrate; and removing remaining portions of the conformal layer from the substrate.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a mask layer over a substrate, wherein the mask layer includes a plurality of openings;
   growing a first plurality of nanowires through the plurality of openings;
   forming a conformal layer over the first plurality of nanowires and the mask layer;
   planarizing the conformal layer over the first plurality of nanowires to form a coplanar top surface defined by the first plurality of nanowires and the conformal layer;
   removing a portion of the conformal layer and a portion of the mask layer to expose the substrate, wherein the portions of the conformal layer and the mask layer are located between adjacent nanowires from the plurality of nanowires; and
   growing a second plurality of nanowires on the exposed substrate.

2. The method of claim 1, wherein forming the conformal layer over the first plurality of nanowires and the mask layer includes forming the conformal layer along a sidewall of each of the first plurality of nanowires, wherein after forming the conformal layer over the first plurality of nanowires the respective conformal layer along each sidewall of each of the first plurality of nanowires has a thickness so as to cause the respective conformal layer of each of the first plurality of nanowires to be in contact with the respective conformal layer of an adjacent nanowire.

3. The method of claim 2, wherein after removing the portion of the conformal layer and the portion of the mask layer a portion of the sidewall of each of the first plurality of nanowires is exposed.

4. The method of claim 1, wherein the first plurality of nanowires and the second plurality of nanowires are each formed of different materials.

5. The method of claim 1, wherein the first plurality of nanowires are formed of a semiconductor material and the second plurality of nanowires are each formed of the same semiconductor materials but with different conductive type.

6. The method of claim 1, wherein each of the first plurality of nanowires is formed of a material selected from the group consisting of silicon, germanium, silicon germanium, III/V compound materials, and a combination thereof.

7. The method of claim 1, wherein each of the second plurality of nanowires is formed of a material selected from the group consisting of silicon, germanium, silicon germanium, III/V compound materials, and a combination thereof.

8. The method of claim 1, further comprising removing remaining portions of the conformal layer and the mask layer from the substrate after growing the second plurality of nanowires on the exposed substrate.

9. The method of claim 1, wherein the conformal layer and each of the first plurality of nanowires have a different etching selectivity.

10. A method comprising:
    growing a first plurality of nanowires through a plurality of openings defined by a mask layer disposed over a substrate;
    forming a conformal layer over the first plurality of nanowires and the mask layer;
    removing a portion of the conformal layer and the mask layer that is positioned between adjacent nanowires from the first plurality of nanowires to expose the substrate;
    growing a second plurality of nanowires on the exposed substrate; and
    removing remaining portions of the conformal layer and the mask layer from the substrate.

11. The method of claim 10, wherein the first plurality of nanowires and the second plurality of nanowires are each formed of different materials.

12. The method of claim 10, wherein the first plurality of nanowires and the second plurality of nanowires are each formed of the same semiconductor materials but with different conductive type.

13. The method of claim 10, wherein each of the first plurality of nanowires is formed of a material selected from the group consisting of silicon, germanium, silicon germanium, III/V compound materials, and a combination thereof.

14. The method of claim 10, wherein each of the second plurality of nanowires is formed of a material selected from the group consisting of silicon, germanium, silicon germanium, III/V compound materials, and a combination thereof.

15. A method comprising:
    forming a first array of nanowires over a substrate;
    forming a conformal layer over the first array of nanowires;
    removing a first portion of the conformal layer to expose the first array of nanowires;
    removing a second portion of the conformal layer that is positioned between adjacent nanowires from the first array of nanowires to expose the substrate;
    forming a second array of nanowires on the exposed substrate; and
    removing remaining portions of the conformal layer from the substrate.

16. The method of claim 15, wherein removing the first portion of the conformal layer to expose the first array of nanowires includes performing a chemical mechanical polishing process.

17. The method of claim 16, wherein after removing the first portion of the conformal layer to expose the first array of nanowires, a top surface of one of the nanowires from the first array is substantially coplanar with a top surface of the conformal layer.

18. The method of claim 15, wherein forming the first array of nanowires includes performing a selective area growth metal organic chemical vapor deposition (SAG MOCVD).

19. The method of claim 15, wherein the first array of nanowires and the second array of nanowires are each formed of different materials.

20. The method of claim 15, wherein removing the second portion of the conformal layer that is positioned between adjacent nanowires from the first array of nanowires to expose the substrate includes performing a dry etching process.

* * * * *